United States Patent

Barth, Jr. et al.

(10) Patent No.: US 8,877,603 B2
(45) Date of Patent: Nov. 4, 2014

(54) SEMICONDUCTOR-ON-OXIDE STRUCTURE AND METHOD OF FORMING

(75) Inventors: John E. Barth, Jr., Williston, VT (US);
Herbert L. Ho, New Windsor, NY (US);
Babar A. Khan, Ossining, NY (US);
Kirk D. Peterson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 52 days.

(21) Appl. No.: 13/435,056

(22) Filed: Mar. 30, 2012

(65) Prior Publication Data

US 2013/0256830 A1 Oct. 3, 2013

(51) Int. Cl.
*H01L 21/76* (2006.01)
*H01L 21/30* (2006.01)
*H01L 21/46* (2006.01)

(52) U.S. Cl.
USPC .......................................... 438/424; 438/458

(58) Field of Classification Search
None
See application file for complete search history.

(56) References Cited

U.S. PATENT DOCUMENTS

| 5,413,952 | A | 5/1995 | Pages et al. |
| 6,057,212 | A | 5/2000 | Chan et al. |
| 6,255,731 | B1 | 7/2001 | Ohmi et al. |
| 7,148,121 | B2 | 12/2006 | Houston |
| 7,208,392 | B1 | 4/2007 | Jaussaud et al. |
| 7,238,591 | B1 * | 7/2007 | Lin ................................ 438/459 |
| 2010/0173473 | A1 * | 7/2010 | Jinbo et al. .................... 438/458 |
| 2011/0136320 | A1 * | 6/2011 | Yamazaki et al. ............. 438/458 |
| 2011/0159611 | A1 * | 6/2011 | Akimoto et al. ................ 438/26 |
| 2011/0175146 | A1 * | 7/2011 | Ohnuma ....................... 257/255 |

FOREIGN PATENT DOCUMENTS

JP 4-148525 5/1992

* cited by examiner

*Primary Examiner* — Mark Tornow
*Assistant Examiner* — Priya Rampersaud
(74) *Attorney, Agent, or Firm* — Michael J. Le Strange; Hoffman Warnick LLC

(57) ABSTRACT

Semiconductor-on-oxide structures and related methods of forming such structures are disclosed. In one case, a method includes: forming a first dielectric layer over a substrate; forming a first conductive layer over the first dielectric layer, the first conductive layer including one of a metal or a silicide; forming a second dielectric layer over the first conductive layer; bonding a donor wafer to the second dielectric layer, the donor wafer including a donor dielectric and a semiconductor layer; cleaving the donor wafer to remove a portion of the donor semiconductor layer; forming at least one semiconductor isolation region from an unremoved portion of the donor semiconductor layer; and forming a contact to the first conductive layer through donor dielectric and the second dielectric layer.

14 Claims, 12 Drawing Sheets

SEMICONDUCTOR-ON-OXIDE STRUCTURE AND METHOD OF FORMING

FIELD OF THE INVENTION

The subject matter disclosed herein relates to a semiconductor-on-oxide based semiconductor structure. More specifically, the subject matter disclosed herein relates to a semiconductor structure having a semiconductor-on-oxide substrate with a relatively low resistance.

BACKGROUND

In certain integrated circuit devices undesirable circuit noise can occur. This noise may be caused by large switching currents in these circuits. Previous attempts to reduce this noise have failed in a variety of ways.

BRIEF SUMMARY

Semiconductor-on-oxide structures and related methods of forming such structures are disclosed. In various embodiments, a method includes: forming a first dielectric layer over a substrate; forming a first conductive layer over the first dielectric layer, the first conductive layer including one of a metal or a silicide; forming a second dielectric layer over the first conductive layer; bonding a donor wafer to the second dielectric layer, the donor wafer including a donor dielectric and a semiconductor layer; cleaving the donor wafer to remove a portion of the donor semiconductor layer; forming at least one semiconductor isolation region from an unremoved portion of the donor semiconductor layer; and forming a contact to the first conductive layer through the donor dielectric and the second dielectric layer.

A first aspect of the invention includes a method including: forming a first dielectric layer over a substrate; forming a first conductive layer over the first dielectric layer, the first conductive layer including one of a metal or a silicide; forming a second dielectric layer over the first conductive layer; bonding a donor wafer to the second dielectric layer, the donor wafer including a donor dielectric and a semiconductor layer; cleaving the donor wafer to remove a portion of the donor semiconductor layer; forming at least one semiconductor isolation region from an unremoved portion of the donor semiconductor layer; and forming a contact to the first conductive layer through the donor dielectric and the second dielectric layer.

A second aspect of the invention includes a semiconductor-on-oxide wafer having: a substrate; a first dielectric layer over the substrate; a first conductive layer over the first dielectric layer; a second dielectric layer over the first dielectric layer; a second conductive layer over a portion of the second dielectric layer, the second conductive layer including a separation; a third dielectric layer over the second conductive layer; and a contact extending through the third dielectric layer and the separation in the second conductive layer contacting the first conductive layer.

A third aspect of the invention includes a semiconductor-on-oxide wafer including: a substrate; a first dielectric layer over the substrate; a first conductive layer over the first dielectric layer; a second dielectric layer over the first dielectric layer; a second conductive layer over a portion of the second dielectric layer, the second conductive layer including a separation; a third dielectric layer over the second conductive layer; and an insulated contact extending through the third dielectric layer and the separation in the second conductive layer contacting one of the first conductive layer or the substrate, the insulated contact including a liner and a conductive material.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
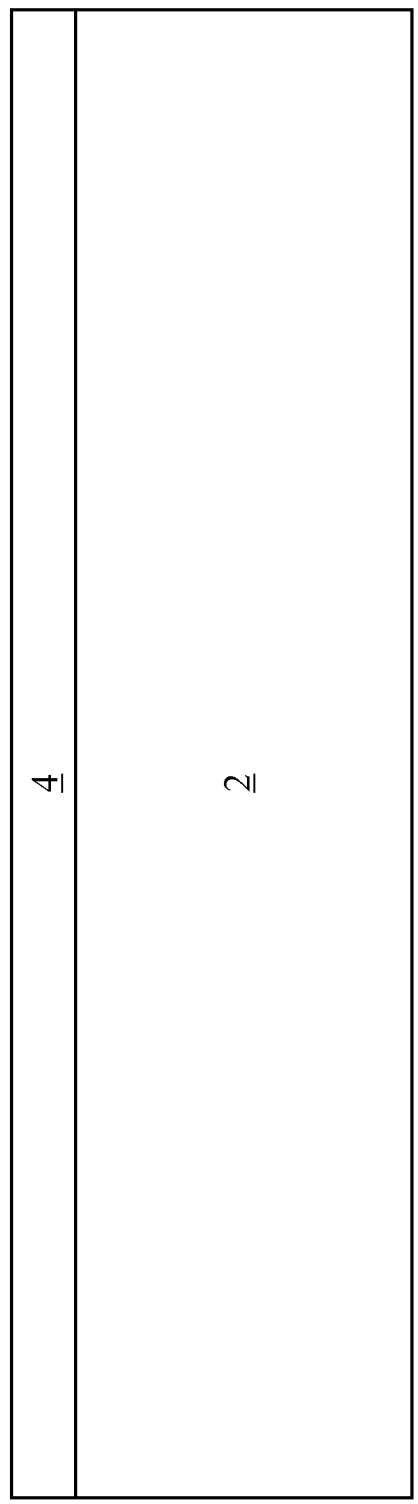
FIGS. 1-8 depict cross-sectional views of semiconductor-on-oxide structures undergoing processes according to various embodiments of the invention.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted herein, the subject matter disclosed relates to a semiconductor-on-oxide based integrated circuit structure. Various embodiments include an integrated circuit structure with a semiconductor-on-oxide substrate (e.g., a silicon-on-insulator, or SOI substrate) having a relatively low resistance.

Turning to FIG. 1, a side cross-sectional view of a substrate (or simply, substrate) 2 and a first dielectric layer 4 (e.g., an oxide) formed over the substrate 2, is shown according to embodiments of the invention. In some cases, the substrate 2 can include, but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire substrate 2 may be strained.

In any case, according to various embodiments of the invention, the first dielectric layer 4 can be formed over the substrate 2 using any conventional deposition techniques describe herein and/or known in the art. For example, deposition techniques or the term "depositing" may be used to refer to any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2:
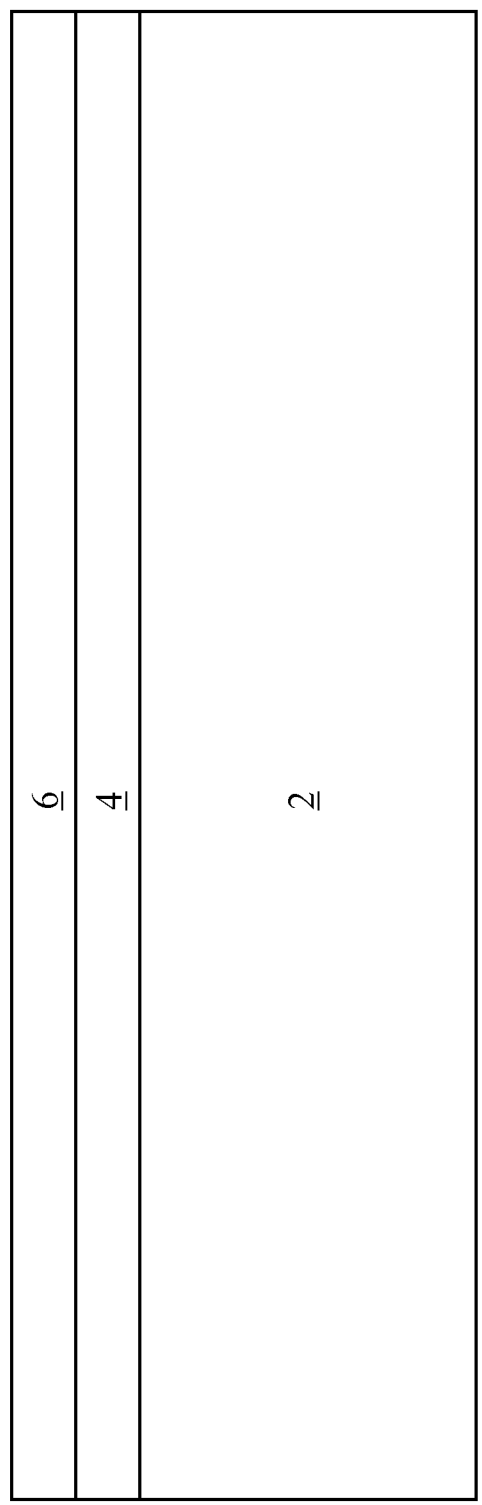

FIG. 2 illustrates another process according to various embodiments of the invention, the process including forming a first conductive layer 6 over the first dielectric layer 4. The first conductive layer 6 can be formed by any conventional deposition techniques described herein. Further the first conductive layer 6 could include a metal (e.g., tungsten (W)) and/or a silicide such as tungsten silicide. In the case that first conductive layer 6 includes a silicide, the silicide may be formed using any now known or later developed technique, e.g., sputtering tungsten silicide over the first dielectric layer 4. It is understood that where the conductive layer 6 includes a silicide, that silicide can be formed using any conventional technique described herein and/or known in the art.

Figure 3:
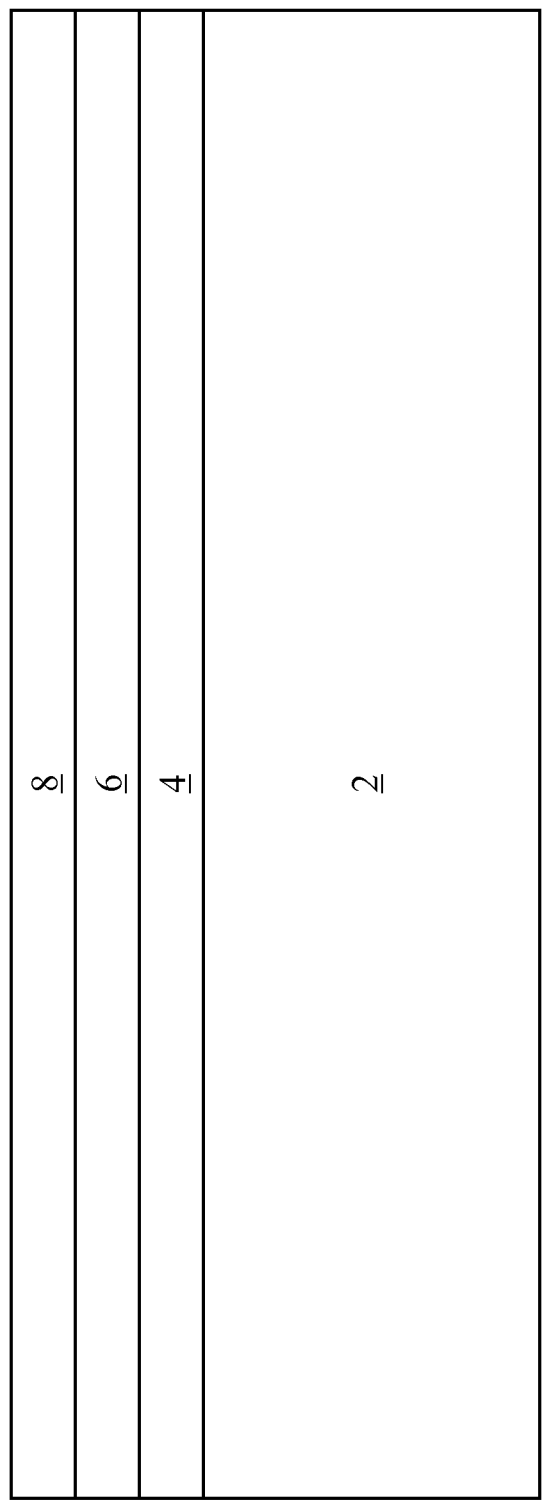

FIG. 3 illustrates another process according to various embodiments of the invention, the process including forming a second dielectric layer 8 (e.g., an oxide) over the first conductive layer 6. The second dielectric layer 8 can be formed according to one or more of the various deposition techniques described herein and/or known in the art.

Figure 4:
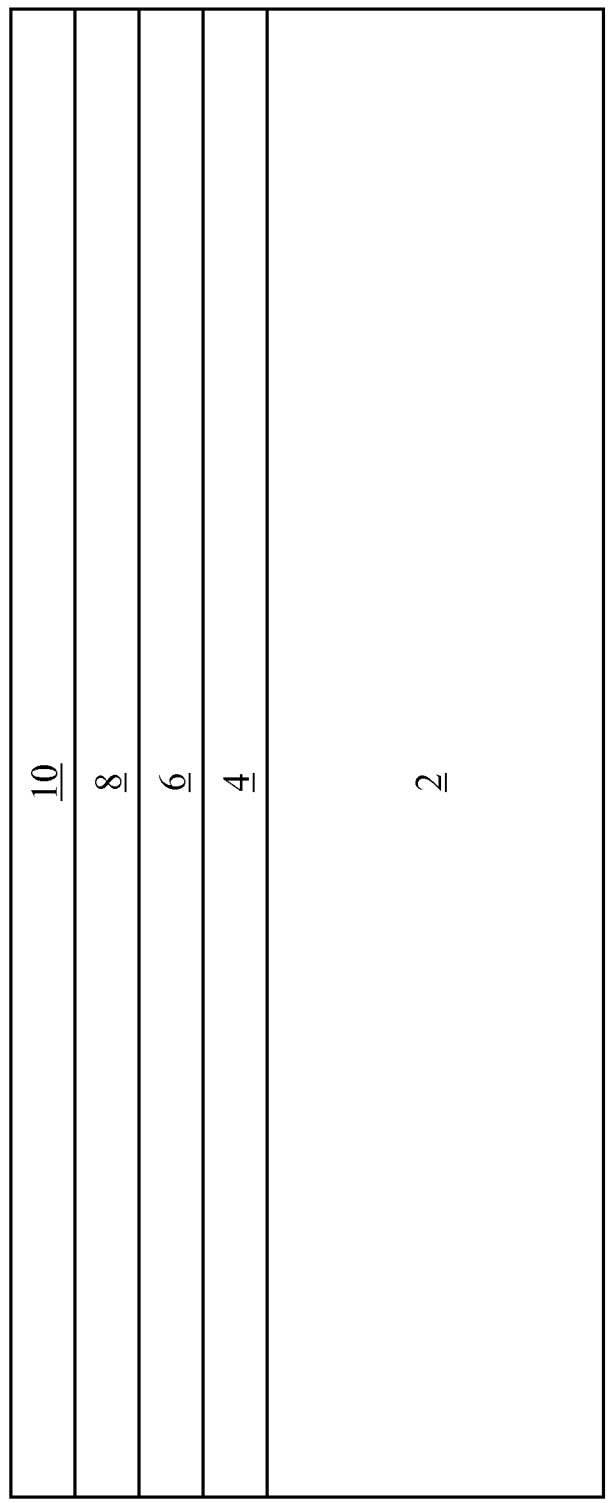

FIG. 4 illustrates another process according to various embodiments of the invention, the process including forming a second conductive layer 10 over the second dielectric layer 8. The second conductive layer 10 can be formed by any conventional deposition techniques described herein. Further the second conductive layer 10 could include a metal (e.g., tungsten (W)) and/or a silicide such as tungsten silicide. In the case that second conductive layer 10 includes a silicide, the silicide may be formed using any now known or later developed technique, e.g., sputtering tungsten silicide over the second dielectric layer 8. It is understood that where the second conductive layer 10 includes a silicide, that silicide can be formed using any conventional technique described herein and/or known in the art.

Figure 5:
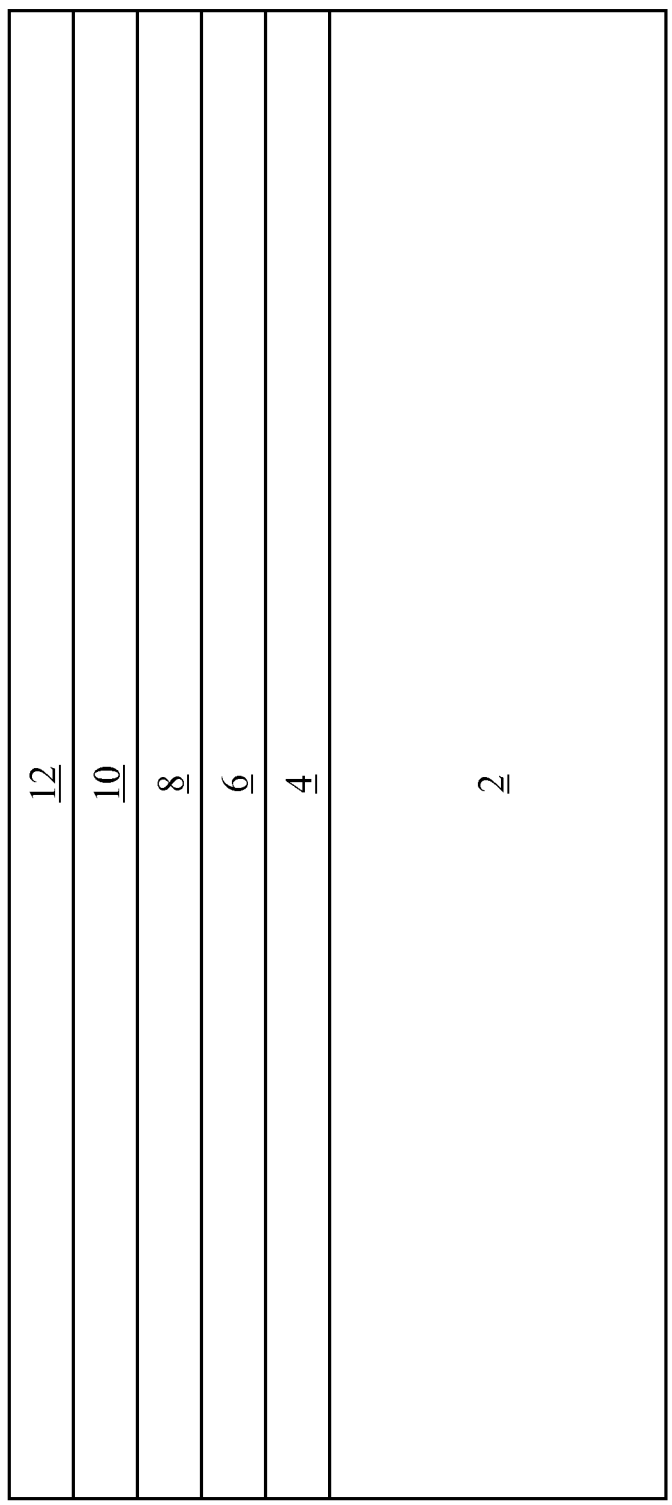

FIG. 5 illustrates another process according to various embodiments of the invention, the process including forming a third dielectric layer 12 (e.g., an oxide) over the second conductive layer 10. The third dielectric layer 12 can be formed according to one or more of the various deposition techniques described herein and/or known in the art.

Figure 6:
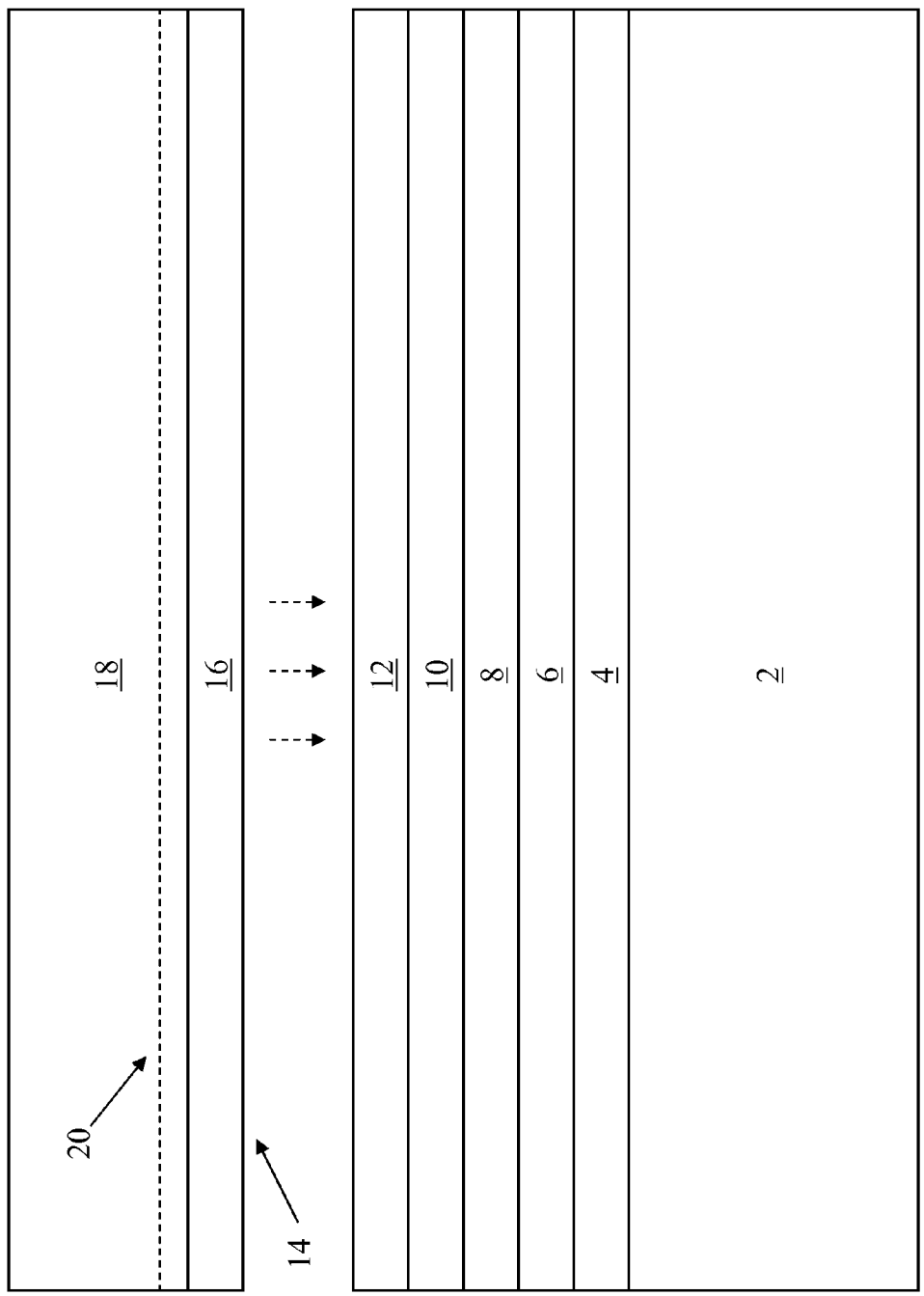

FIG. 6 illustrates an additional process including bonding of a donor wafer 14 to the third dielectric layer 12, e.g., to a surface of the third dielectric layer 12. In some cases, the donor wafer 14 can include a donor dielectric 16 and a semiconductor (e.g., silicon) layer 18. As is known in the art of the conventional semiconductor-on-oxide (e.g., SOI) fabrication, the donor wafer 14 can be implanted, e.g., with hydrogen or another implant species, to form an implant line 20 for later separation of the donor wafer 14.

Figure 7:
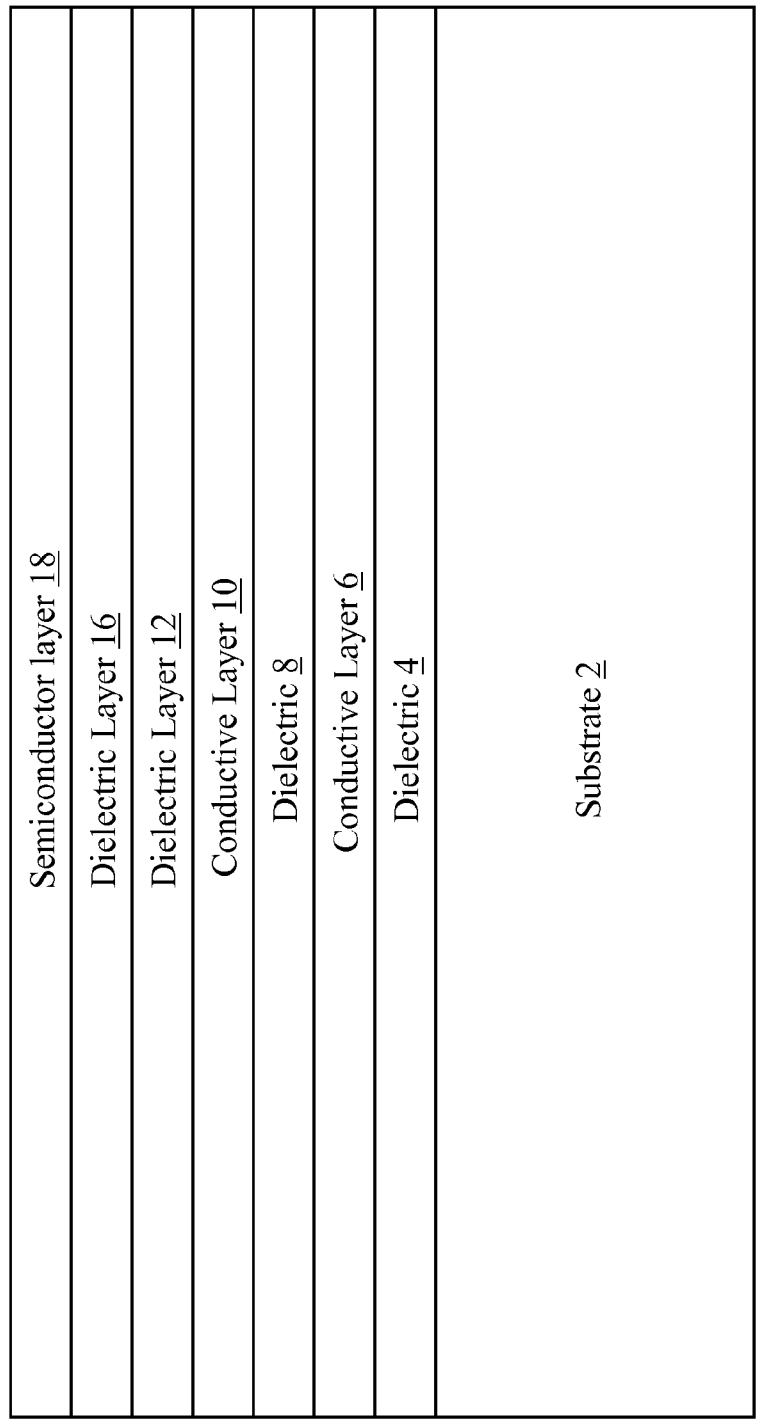

FIG. 7 illustrates an additional process including, after bonding of the donor wafer 14 to the third dielectric layer 12, cleaving the donor wafer to remove a portion of the donor semiconductor (e.g., silicon) layer 18. It is understood that in some cases, the third dielectric layer 12 and the donor dielectric layer 16 can join during the bonding to collectively form a single dielectric layer.

For ease of understanding the subject matter disclosed herein, FIGS. 8-11 include general indicators of the materials included in each layer or groups of layers in the semiconductor-on-oxide (e.g., SOI) structures. That is, instead of referring to a "first", "second" or "third" dielectric layer, a general "dielectric layer" is indicated. Similarly, "first" and "second" conductive layers can be indicated simply as "conductive layers."

Figure 8:
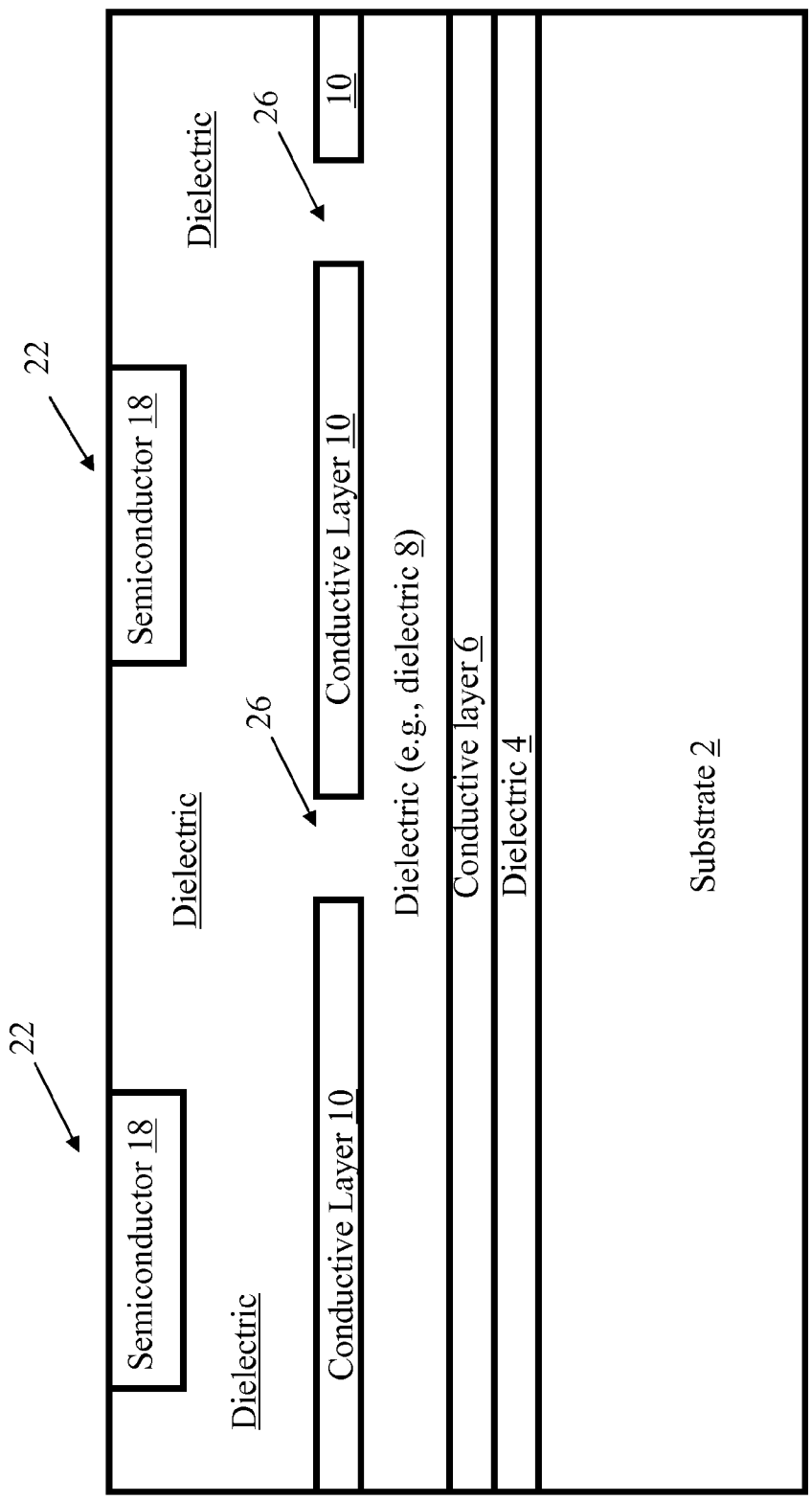

FIG. 8 illustrates an additional process including forming at least one semiconductor isolation region (or, semiconductor "island") 22 from an unremoved (remaining after cleaving) portion of the donor semiconductor layer 18. As noted herein, in some embodiments, the semiconductor isolation region 22 can include silicon. The process can further include depositing an additional dielectric to contact one or more sidewalls of the semiconductor isolation region 22. During this process, traditional shallow trench isolation (STI) techniques can be used, e.g., to mask and etch openings in the semiconductor layer 18 and fill those openings with a material such as the dielectric material. Additionally, a plurality of openings 26 can be formed in one or more conductive layers 10 (and conductive layer 6, FIG. 9). These openings 26 can be formed by conventional masking and etching techniques known in the art and described herein. These openings 26 can further be filled by a dielectric (e.g., dielectrics described herein).

In some cases, openings 26 are formed during a separate patterning/etching step than the semiconductor isolation regions 22. That is, in these cases, the semiconductor 18 may be masked and etched in order to form the semiconductor isolation regions 22. The gaps between these isolation regions 22 may then be filled by a deposited dielectric. Subsequent to filling these gaps, the semiconductor isolation regions 22 and the dielectric can be planarized (e.g., by CMP). The openings 26 can then be formed by a separate masking/etching step which may include masking the isolation regions 22 and portions of the dielectric, and then etching to open the dielectric and a portion of the conductive layer 10 to form openings 26. These openings can then be filled with additional dielectric (e.g., via deposition) according to known methods. Following this process, the structure can then be planarized again to cure one or more surface irregularities.

Figure 9:
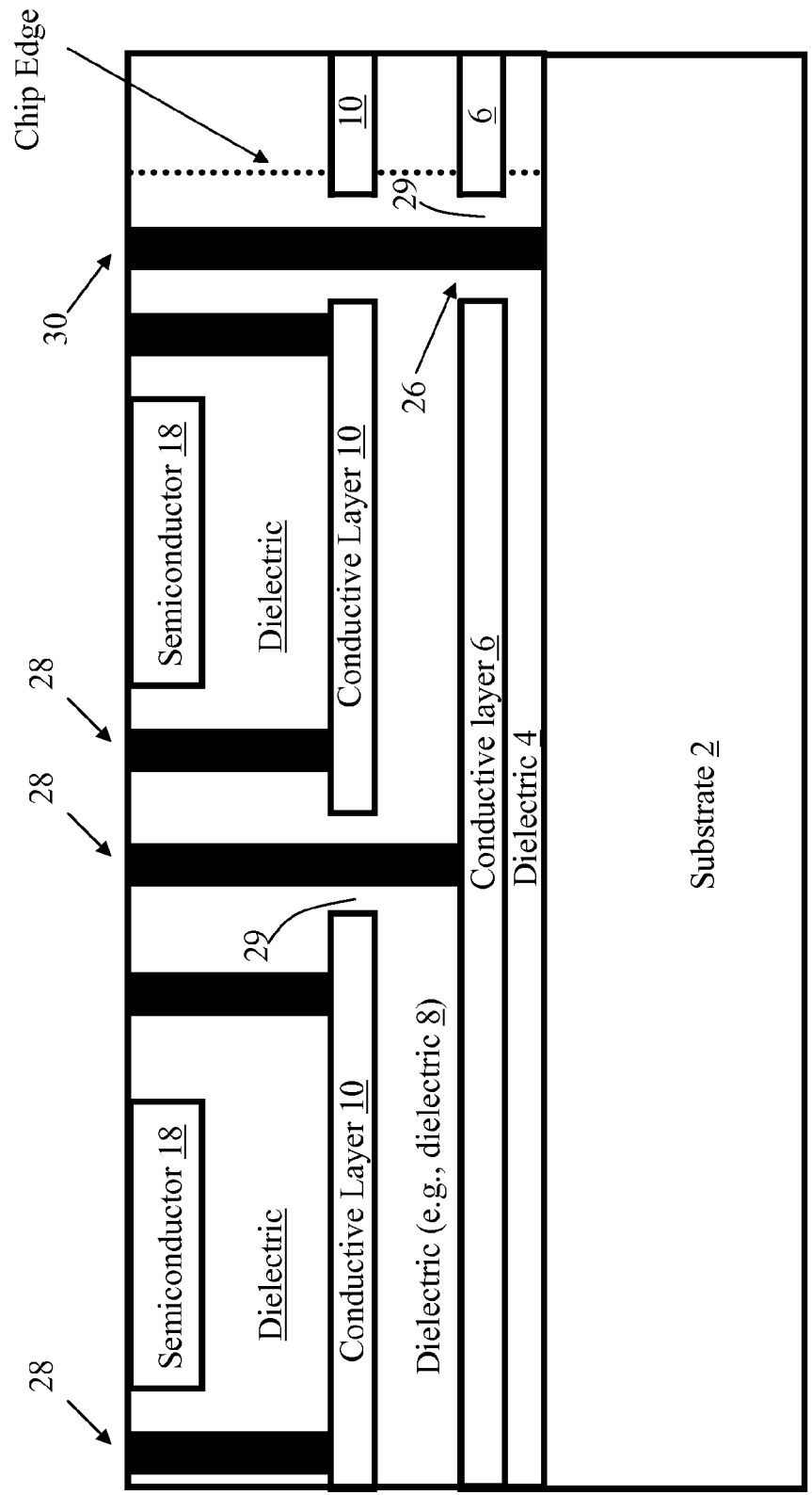
FIG. 9 shows a semiconductor-on-oxide structure according to various embodiments of the invention.

Turning to FIG. 9, following the forming of openings 26 in the conductive layer 10 (e.g., second conductive layer), in a separate patterning step, one or more additional opening(s) 26 can be formed in the underlying conductive layer 6 (e.g., first conductive layer). As noted, the additional opening(s) 26 in the conductive layer 6 can be formed by masking the semiconductor and dielectric layer, and etching through an exposed portion of the dielectric (e.g., the dielectric 8 and dielectric 4) as well as the conductive layer 6 to contact the substrate 2. This process can further include filling the opening 26 with a dielectric, as described with respect to the openings in conductive layer 10.

As shown in FIG. 9, previously formed openings (e.g., 26 in FIGS. 8-9) can later be used as locations for forming of a contact 28 through the openings and the dielectric (e.g., dielectric 8) to the conductive layer 6. In some cases, a contact 30 can be formed through the openings in the conductive layer 10 and the conductive layer 6, e.g., to contact the substrate 2. In this case, the contact 30 can be located proximate an edge of a chip division in the wafer (e.g., where later dicing of the chip will occur). Additional contacts 28 (and/or contacts 30) can be formed to one of the conductive layers (e.g., conductive layer 6 or conductive layer 10. These contacts 28, 30 can be formed by masking the SOI structure and etching to form openings to contact one of the conductive layers, and subsequently depositing or epitaxially growing a conductive material in that opening. The contacts 28, 30 can be formed of any conductive material suitable to provide an electrical connection with the conductive layer(s), and can include a conductive metal such as tungsten or copper, or a polysilicon.

As shown in FIG. 9, separations 29 exist between each conductive layer 6, 10 and the contact 28, 30 which passes through that conductive layer (e.g., 6 or 10). That is, the contact 28, 30 is insulated from the respective conductive layers by separations 29 formed of dielectric material. This is distinct from the embodiment shown and described with reference to FIG. 10, which uses one or more liners to electrically insulate contacts 28, 30 from the conductive layers 6, 10.

Figure 10:
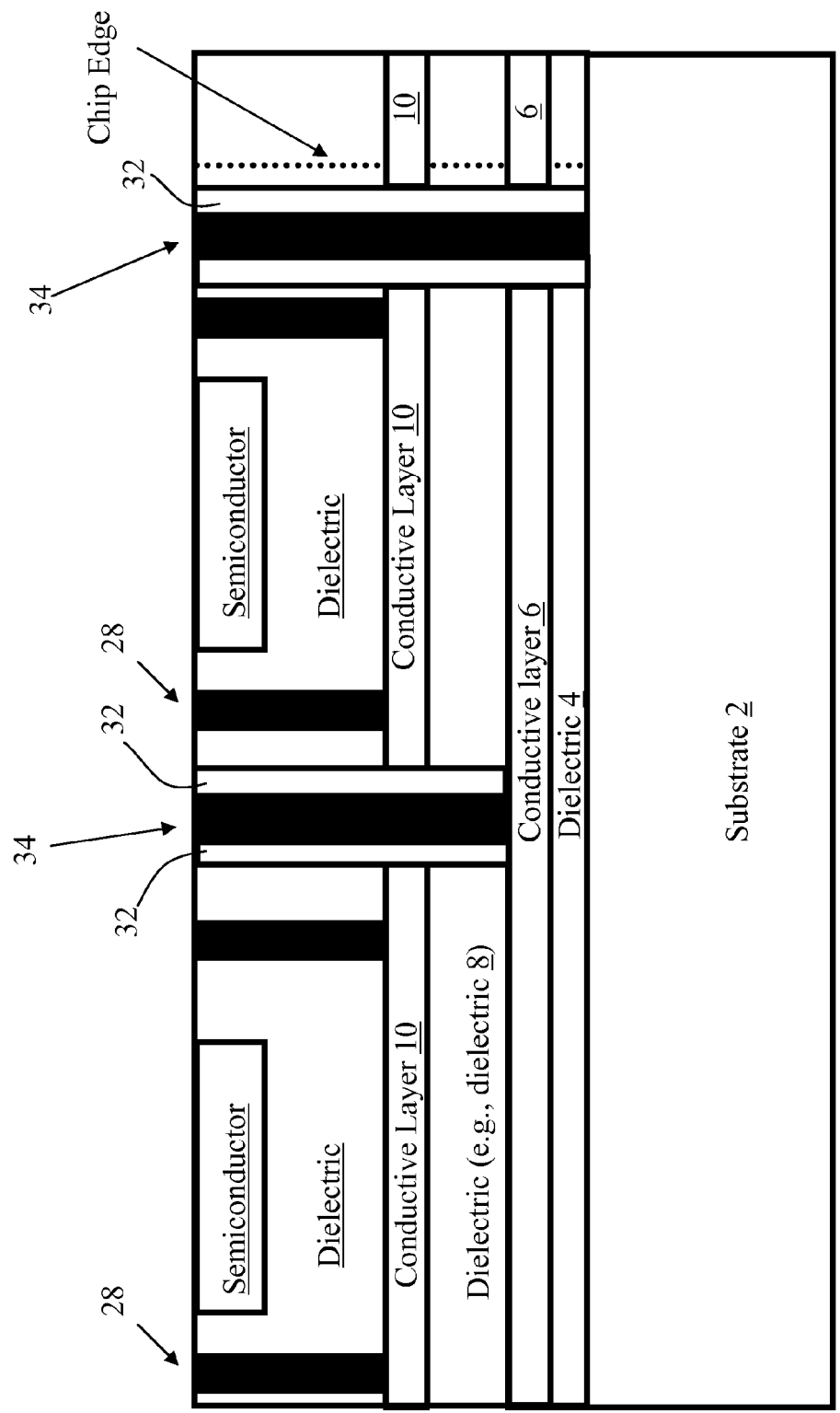
FIG. 10 shows a semiconductor-on-oxide structure according to various additional embodiments of the invention.

FIG. 10 shows an alternative embodiment of forming a semiconductor-on-oxide structure, where the semiconductor-on-oxide structure includes one or more spacers 32 formed alongside (and insulating) contacts 34. In some embodiments, the spacers 32 can be formed in an opening prior to the forming of the contacts 34. In particular, an opening as wide as the spacers 32 and contact 34 combined is formed in the underlying dielectric layer(s), e.g., by conventional masking and etching techniques described herein. Following formation of the opening, spacer material can be conformally formed (e.g., deposited) in that opening such that the spacer material lines the sidewalls of the opening and the bottom of the opening. The spacer material along the bottom of the opening can then be etched (e.g., via an oxide etch such as reactive ion etching, or RIE) to remove the spacer material at the bottom of the opening. The contact 34 can then be formed to fill the portion of the opening not occupied by the spacer 32. The resulting structure can then be planarized according to various embodiments of the invention. It is further understood that in this embodiment, additional contacts 28 (and/or contacts 30, not shown) can be formed in a similar manner as described with respect to FIG. 9, e.g., without spacers 32. It is also understood that in various embodiments, formation of contacts 28 and contacts 32 are performed using distinct patterning and etching steps.

Figure 11:
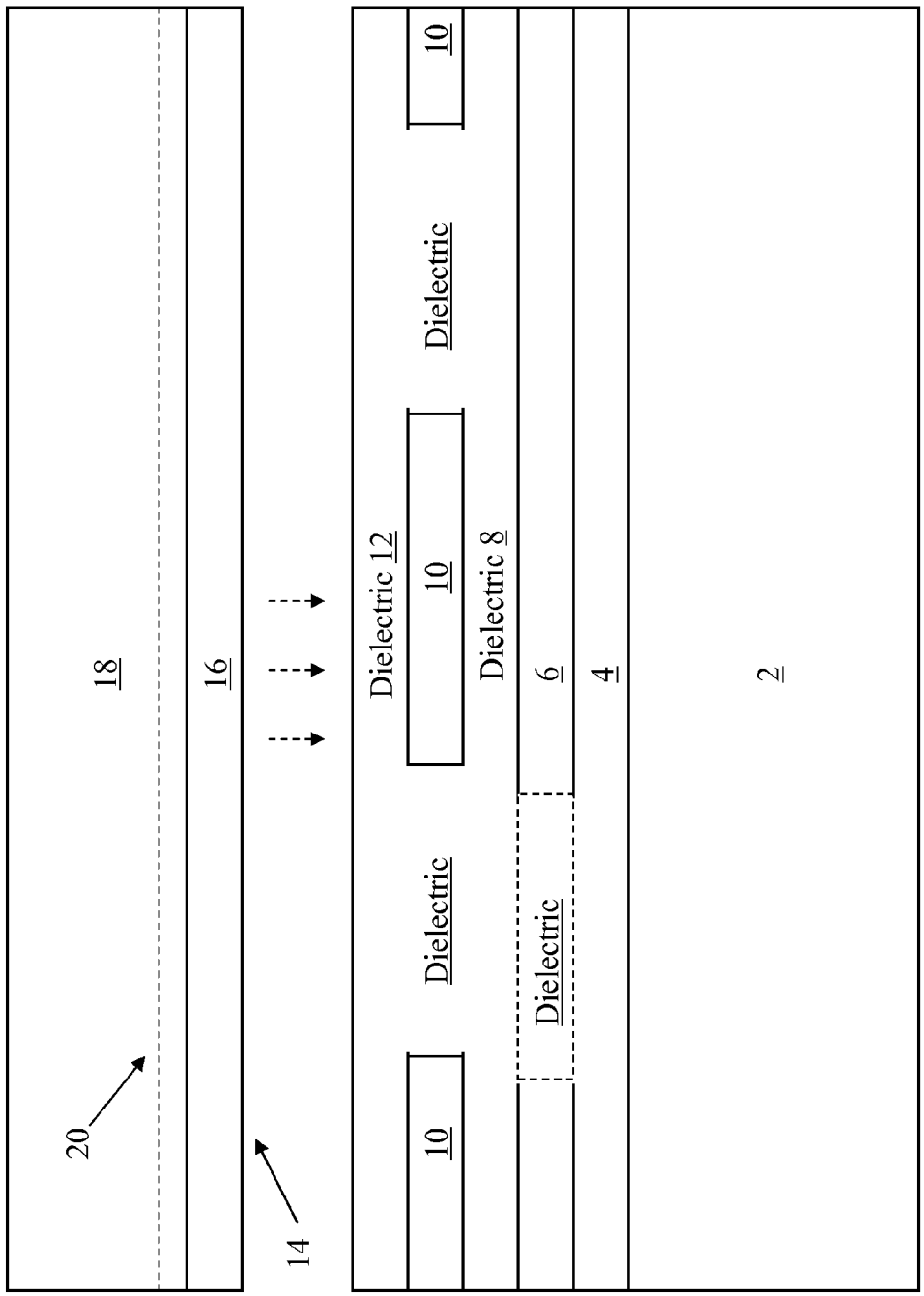
FIG. 11 shows an alternative embodiment of the semiconductor-on-oxide structure in FIG. 6 according to various embodiments.

FIG. 11 shows an alternative embodiment of the structure depicted in FIG. 6, prior to joining of the donor wafer 14 with the handle substrate (including dielectric 12, conductor layer 6, 10, dielectrics 4, 8 and substrate 2) at the dielectric 12. In this alternative embodiment, the conductive layer 10 can be pre-patterned prior to bonding of the donor wafer 14 to the dielectric 12. That is, the dielectric 12 can be masked and etched to form openings through the dielectric and the underlying conductor 10, where those openings are then filled by a dielectric (e.g., via deposition described herein). The resulting structure, shown in FIG. 11, can then be bonded with the donor wafer 14 as described with respect to FIGS. 6-7. The subsequent processes can remain substantially similar, except that patterning of the dielectric layer 10 is not necessary after the bonding of the donor wafer 14 in these embodiments. It is further understood that the first conductive layer 6 could also be pre-patterned and filled with a dielectric, as shown in phantom in FIG. 11. The first conductive layer 6 and/or the second conductive layer 10 can be pre-patterned in any desired manner to aid in subsequently forming contacts after bonding of the donor wafer with the handle substrate.

Figure 12:
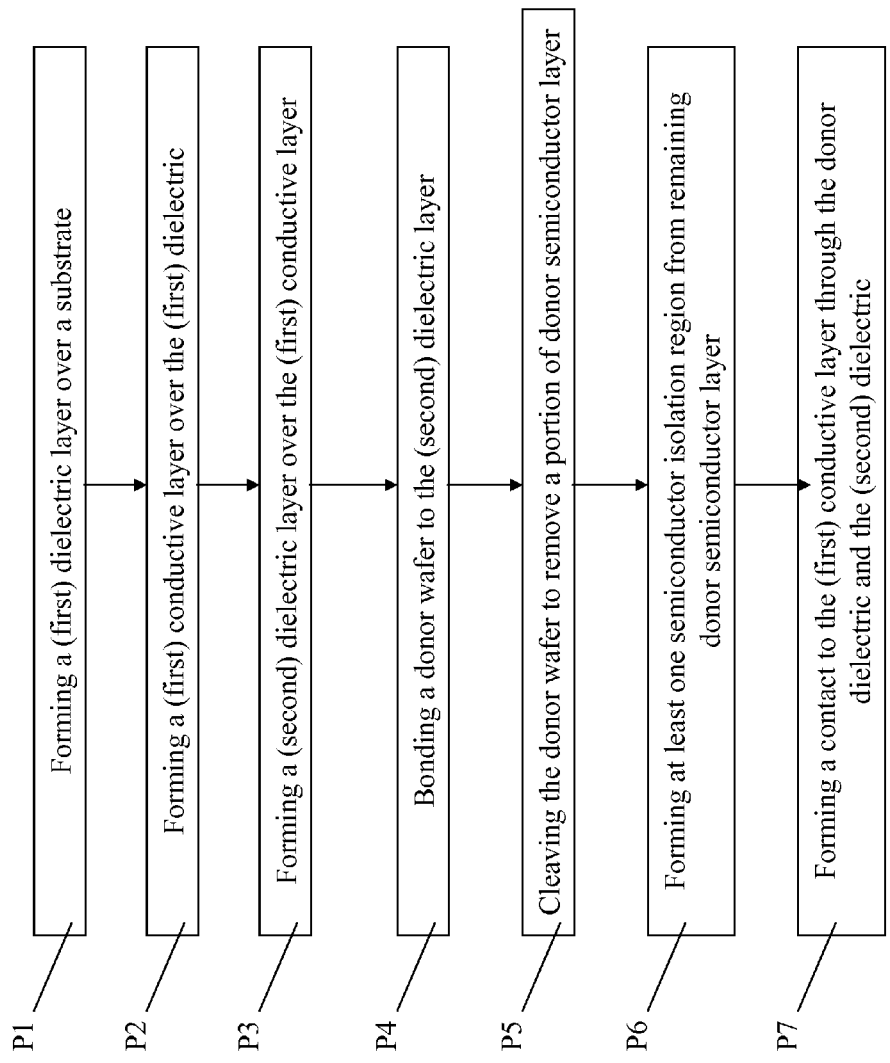
FIG. 12 shows a flow diagram illustrating processes according to various embodiments of the invention.

FIG. 12 is a method flow diagram illustrating processes according to various aspects of the invention. As shown, one method can include the following processes:

Process P1: Forming a dielectric layer (e.g., a first dielectric layer) over a substrate;

Process P2: Forming a conductive layer (e.g., a first conductive layer) over the dielectric layer;

Process P3: Forming a dielectric layer (e.g., a second dielectric layer) over the conductive layer;

Process P4: Bonding a donor wafer to the dielectric layer;

Process P5: Cleaving the donor wafer to remove a portion of the donor semiconductor layer (e.g., above the implant line);

Process P6: Forming at least one semiconductor isolation region from an unremoved (remaining after cleaving) portion of the donor semiconductor layer; and Process P7: Forming a contact to the conductive layer (e.g., the first conductive layer) through the donor dielectric and the underlying dielectric (e.g., the second dielectric).

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A method of forming a semiconductor-on-oxide structure, the method comprising:

forming a first dielectric layer over a substrate;

forming a first conductive layer over the first dielectric layer, the first conductive layer including one of a metal or a silicide;

forming a second dielectric layer over the first conductive layer;

bonding a donor wafer to the second dielectric layer, the donor wafer including a donor dielectric and a semiconductor layer;

cleaving the donor wafer to remove a portion of the donor semiconductor layer;

forming at least one semiconductor isolation region from an unremoved portion of the donor semiconductor layer; and forming a contact to the first conductive layer through the donor dielectric and the second dielectric layer.

2. The method of claim 1, wherein the contact includes at least one of tungsten, copper or polysilicon, and the semiconductor layer includes silicon.

3. The method of claim 1, wherein the forming of the at least one semiconductor isolation region includes etching the unremoved portion of the donor semiconductor layer; and forming an additional dielectric partially surrounding the etched unremoved portion of the donor semiconductor layer.

4. The method of claim 1, further comprising forming a plurality of contacts to the first conductive layer.

5. The method of claim 1, further comprising forming a second conductive layer over the second dielectric layer, the second conductive layer including one of a metal or a silicide.

6. The method of claim 5, further comprising:

forming openings in the second conductive layer; and forming the contact to the first conductive layer through at least one of the openings.

7. The method of claim 6, further comprising forming a second contact to the second conductive layer.

8. The method of claim 7, wherein the forming of the second contact includes:
   forming a liner along a sidewall of each of the openings; and
   depositing a contact material to contact the second conductive layer.

9. The method of claim 1, wherein the substrate includes silicon.

10. The method of claim 1, wherein the forming of the at least one semiconductor isolation region from the unremoved portion of the donor semiconductor layer is performed after the cleaving of the donor wafer.

11. The method of claim 10, wherein the forming of the contact to the first conductive layer through the donor dielectric and the second dielectric layer is performed after the forming of the at least one semiconductor isolation region.

12. The method of claim 6, wherein the forming of the contact to the first conductive layer through at least one of the openings includes directly contacting the first conductive layer with the contact.

13. A method of forming a semiconductor-on-oxide structure, the method comprising:
   forming a first dielectric layer over a substrate;
   forming a first conductive layer over the first dielectric layer, the first conductive layer including one of a metal or a silicide;
   forming a second dielectric layer over the first conductive layer;
   bonding a donor wafer to the second dielectric layer, the donor wafer including a donor dielectric and a semiconductor layer;
   cleaving the donor wafer to remove a portion of the donor semiconductor layer;
   forming at least one semiconductor isolation region from an unremoved portion of the donor semiconductor layer after the cleaving of the donor wafer to remove the portion of the donor semiconductor layer; and
   forming a contact to the first conductive layer through the donor dielectric and the second dielectric layer after the forming of the at least one semiconductor isolation region.

14. The method of claim 13, further comprising:
   forming a second conductive layer over the second dielectric layer, the second conductive layer including one of a metal or a silicide;
   forming openings in the second conductive layer; and
   forming the contact to the first conductive layer through at least one of the openings in the second conductive layer after the forming of the openings in the second conductive layer.

* * * * *